United States Patent [19]
Agrawal

[11] Patent Number: 5,983,007
[45] Date of Patent: Nov. 9, 1999

[54] LOW POWER CIRCUITS THROUGH HAZARD PULSE SUPPRESSION

[75] Inventor: Vishwani Deo Agrawal, New Providence, N.J.

[73] Assignee: Lucent Technologies Inc., Murray Hill, N.J.

[21] Appl. No.: 08/866,755

[22] Filed: May 30, 1997

Related U.S. Application Data

[60] Provisional application No. 60/031,220, Nov. 25, 1996.

[51] Int. Cl.$^6$ ...................................................... G06F 17/50
[52] U.S. Cl. ............................... 395/500.07; 395/500.03
[58] Field of Search ................................. 364/488–491, 364/578; 395/500.02–500.19

[56] References Cited

U.S. PATENT DOCUMENTS

| | | | |
|---|---|---|---|
| 5,392,221 | 2/1995 | Donath et al. ........................... | 364/489 |
| 5,768,145 | 6/1998 | Roethig .................................... | 364/488 |
| 5,831,864 | 11/1998 | Raghunathan et al. ................. | 364/488 |
| 5,835,380 | 11/1998 | Roethig .................................... | 364/488 |
| 5,847,966 | 12/1998 | Uchino et al. ........................... | 364/489 |
| 5,880,967 | 3/1999 | Jyu et al. ................................. | 364/489 |

OTHER PUBLICATIONS

Chen ("Power optimization recasts synthesis", Electronic Engineering Times, No. 904, p. TO8 (pp. 1–4), May 31, 1996).

Potter et al. ("Driven by timing, verification excels",Electronic Engineering Times, No. 867, p. 70 (1–5), Sep. 26, 1995.

Lin et al. ("Power reduction by gate sizing with path–oriented slack calculation", Design Automation Conference, 1995; Proceedings of the ASP–DAC '95/CHDL '95/VLSI '95; IFIP International Conference on Hardware Description Languages; IFIP International C, Aug. 29, 1995.

Tang et al. ("Power dissipation models and performance improvement techniques of CMOS inverters with RC line and tree interconnections", IEE Proceedings G on Circuits, Devices and Systems, vol. 140, No. 6, pp. 437–443, Dec. 1993).

Sobelman et al. ("Low–Power Multiplier Design Using Delayed Evaluation", 1995 IEEE International Symposium on Circuits and Systems, pp. 1–4 (1564–1567), Apr. 28, 1995).

Pedram ("Power estimation and optimization at the logic level", International Journal of High Speed Electronics and Systems, vol. 5, No. 2 (1994), pp. 179–202, Jan. 1994).

Bellaouar et al. "Low–Power Digital VLSI Design", Kluwer Academic Publishers, Chapter 4 (pp. 115–256) and Chapter 8 (pp. 489–526)).

Unger ("Asynchronous Sequential Switching Circuits", Wiley–Interscience, A Division of John Wiley & Sons, Chapter 1 (pp. 1–27) and Chapter 4 (pp. 118–191)).

*Primary Examiner*—Kevin J. Teska
*Assistant Examiner*—Phallaka Kik
*Attorney, Agent, or Firm*—Donald P. Dinella

[57] ABSTRACT

The power dissipation in a circuit, e.g., a CMOS circuit, is reduced through hazard pulse suppression. More particularly, hazard-producing gates are those gates whose delays are smaller than the differential path delays for their inputs. The adjustment to the delay of these gates is made by increasing the gate delay as a function of the corresponding differential path delays to eliminate the production of hazard pulses. Thus, by suppressing the hazard pulses in a circuit the power dissipation of the circuit is substantially reduced.

14 Claims, 6 Drawing Sheets

EFFECT OF GATE DELAY ON ENERGY DISSIPATION

LOW POWER CIRCUITS THROUGH HAZARD PULSE SUPPRESSION

CROSS REFERENCE TO PROVISIONAL APPLICATION

This application claims the benefit of U.S. Provisional Application No. 60/031,220, filed on Nov. 25, 1996.

FIELD OF THE INVENTION

The present invention relates to the design of digital circuits, and more particularly, to the reduction of power dissipation in such circuits.

BACKGROUND OF THE INVENTION

The power consumption of modern electronic equipment has become a critical issue due to the increased popularity of mobile products and the focus on miniaturization. For example, cellular phones are fast becoming a necessity for the everyday consumer, with the size and battery life of such phones being major issues in the purchasing decision. These modern hardware devices contain a significant amount of CMOS semiconductor circuitry. Power consumption in a CMOS circuit is most commonly attributed to at least the following factors: (1) short circuits; (2) leakage; (3) functional switching; and/or (4) hazard pulses. As is well known, power dissipation due to short circuits is often negligible and power consumption due to leakage is significantly smaller than that of functional switching or hazard pulses. Thus, the major contributors in CMOS circuit power dissipation are functional switching and hazard pulses. In particular, it has been reported that hazard pulses consume approximately 20–40% of the total power in digital circuits (see, for example, A. Bellaouar et al., *Low-Power Digital VLSI Design: Circuits and Systems*, Kluwer Academic Publishers, p. 493, Boston, 1995.)

Hazard pulses occur due to the fact that before signals of a digital circuit reach their steady state, the transistor gates making up the circuit incur multiple signal transitions as a function of signals arriving at the gate by paths of varying delays. These transitions generate the hazard pulses in a gate. These extra transitions and the generated hazard pulses of the gates increase the power dissipation of the digital circuit. One known technique for eliminating hazard pulses is to balance the delays of multipath signals serving as input to a gate. The balancing is accomplished either by using a tree-like logic structure or by inserting delay buffers within particular "fast" paths of the circuit (see, Ballaouar, supra.). However, the balancing technique is sensitive to delay tolerances and may, in some cases, actually incur additional power dissipation due to the use of additional delay buffering.

Another known technique for addressing hazard pulses is so called retiming. Retiming employs a flip-flop repositioning scheme within a circuit such that particular flip-flops are moved to circuit nodes having high hazard occurrences. However, one drawback of this approach is that in many instances the number of nodes having potential hazard pulses is much larger than the number of flip-flops available for repositioning (see, for example, J. M. Rabaey et al., *Low Power Design Methodologies*, Kluwer Academic Publishers, pp. 148–149, Boston, 1996.) In addition to the retiming technique there is known the so called self-timing technique in which a combinational element of a circuit will not compute a result until all inputs have stabilized. This technique, however, requires the addition of other circuitry to the overall circuit design thereby increasing the complexity of the circuit.

Finally, in S. H. Unger, *Asynchronous Sequential Switching Circuits*, Wiley-Interscience, pp. 153–163, New York, 1969, a technique for adding inertial delays to the output of a combinational logic circuit is described which eliminates hazard pulses in asynchronous circuits. Significantly, however, this approach may leave hazard pulses on many internal signals of the asynchronous circuit and does not address the issue of power dissipation within the circuit.

Therefore, a need exists for a hazard pulse suppression technique which does not require additional circuitry, effectively handles a potentially large number of hazard pulses within digital circuits, and which contributes to an overall reduction in power dissipation of a circuit.

SUMMARY OF THE INVENTION

The present invention provides a technique for reducing power dissipation in a circuit through hazard pulse suppression. In accordance with the invention, hazard pulses are suppressed by increasing the delays of those gates within the circuit which are candidates for producing hazard pulses. Thus, as a signal propagates through the gates of a circuit configured in accordance with the invention, the signal encounters certain slower gates whose delays have been adjusted to suppress hazard pulses. In accordance with the invention, hazard pulses are suppressed in a circuit, e.g., a CMOS circuit, by increasing the gate delays of the circuit as a function of the individual delays occurring across their inputs. That is, the individual signal delays occurring across the input paths to the gate are examined to determine an appropriate increase to that gate's delay to suppress the generation of a hazard pulse. By suppressing the hazard pulses in a circuit the power dissipation of that circuit is substantially reduced.

In accordance with an embodiment of the invention, the signal delays across each input path to a particular gate within a circuit are identified. Using these input path signal delays, the individual gates of a circuit are analyzed to determine the overall delay for each gate of the circuit. Illustratively, the overall delay for a particular gate encompasses the input path signal delays of the gate and that gate's inherent delay. Again illustratively, this individual gate analysis is performed from the input to the output of the circuit. Based on the overall delays of the gates and the determination of where hazards will occur within the circuit, the delays of certain ones of the gates are increased. In accordance with the invention, the increased delay will eliminate the hazard pulses which would have occurred, and would thereby have caused power dissipation.

DETAILED DESCRIPTION OF THE INVENTION

The present invention provides a technique for reducing the power dissipation in a circuit, e.g., a CMOS circuit, through hazard pulse (hereinafter alternatively referred to as "hazard" or "hazards" for simplicity) suppression. For example, in a CMOS circuit, power is consumed when the circuit's signal values change. Certain signal changes, so called functional signals, cause power consumption but are necessary for circuit functionality. Other signal changes, so called transient signals, are unnecessary for circuit functionality but still require power to be consumed. As discussed previously, the elimination of these transient signals (also known as hazard pulses), and their related power consumption are the main objects of the present invention. More particularly, pursuant to the invention, hazards are suppressed in a circuit by increasing the gate delays of the circuit, illustratively, as a function of the differential multi-path delays of their inputs. Thus, as a signal propagates through the gates of a circuit to its eventual output the signal encounters slower gates. Therefore, hazards are suppressed as they are generated within a circuit thereby avoiding the inherent power dissipation caused by such hazards. A brief discussion of hazards and their related effects on digital circuits will now be provided to facilitate an understanding of the invention.

Not all gates within a circuit produce hazards which contribute to power dissipation. A hazard-producing gate has, at a minimum, the following characteristics: (1) the gate has two or more inputs and (2) the gate's differential delay is greater than zero. A gate's differential delay is a function of the difference between the individual delays exhibited on its various input paths (i.e., the signal paths over which signals are received at the input to the gate). Thus, for example, the differential delay can be taken as the maximum difference between the individual delays associated with a particular gate. These characteristics and the production of hazards will now be discussed in the context of a circuit example to facilitate a better understanding of the overall concepts.

Figure 1:
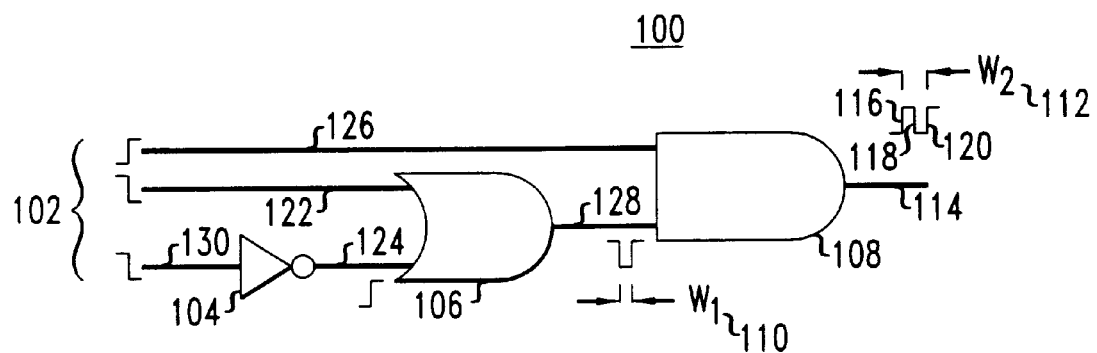
FIG. 1 shows a combinational logic circuit having static and dynamic hazards.

FIG. 1 shows a combinational logic circuit 100 having so called static and dynamic hazards. As is well known, the output of a combinational logic circuit may change several times, as a function of changes to its input, before reaching a steady state. As seen in FIG. 1, combinational logic circuit 100 has simultaneous changes to its input 102 (i.e., 0 to 1, or 1 to 0). Illustratively, each gate of combinational logic circuit 100 has one unit of delay (e.g., one unit of time). OR gate 106 produces a hazard illustratively having a hazard pulse width ($w_1$) 110 equal to a delay of one unit. As will be appreciated by those skilled in the art such a hazard, where the initial and final values of the signal are the same, is known as a static hazard. The output 114 of AND gate 108 has a change in logic from 0 to 1 while incurring a hazard of combined hazard pulse width ($w_2$) 112 of two units. The combined hazard pulse width ($w_2$) 112 consists of three edges, two rising edges 116 and 120, and one falling edge 118. The position of each edge in time corresponds to the delay of a particular input path of combinational logic circuit 100. As will be appreciated by those skilled in the art, since the final steady state of this signal (i.e., the signal associated with AND gate 108) differs from the initial steady state signal, this transient is called a dynamic hazard.

The differential hazard delay $w_d$ of, for example, AND gate 108 is given by the following equation:

$$w_d = \max|\Delta_{ip} - \Delta_{jq}|, \text{ for all } i,j=1, 2 \ldots k, \qquad (1)$$

where $i \neq j$ for all p, q; and $\Delta_{ip}$ is the delay of the pth path arriving at input i.

In other words, the differential hazard delay $w_d$ is defined by analyzing the differential path delays of a particular gate from the various input paths of that gate and selecting the maximum differential path delay calculated. For example, for a single input gate such as inverter 104 shown in FIG. 1, $w_d$ is equal to zero because the delay difference must be taken for paths arriving at different inputs of the gate (note the condition $i \neq j$ of equation (1) above). In contrast, the $w_d$ for OR gate 106 is one unit and two units for AND gate 108. The OR gate 106 has two input paths (122 and 130/124) with delays of 0 and 1 unit, respectively. The AND gate 108 has three input paths (126, 122/128 and 130/124/128) with delays of 0, 1 and 2 units, respectively. As will be appreciated, these hazard pulses can be analyzed to determine their particular impact on power dissipation of the overall circuit.

Figure 2:
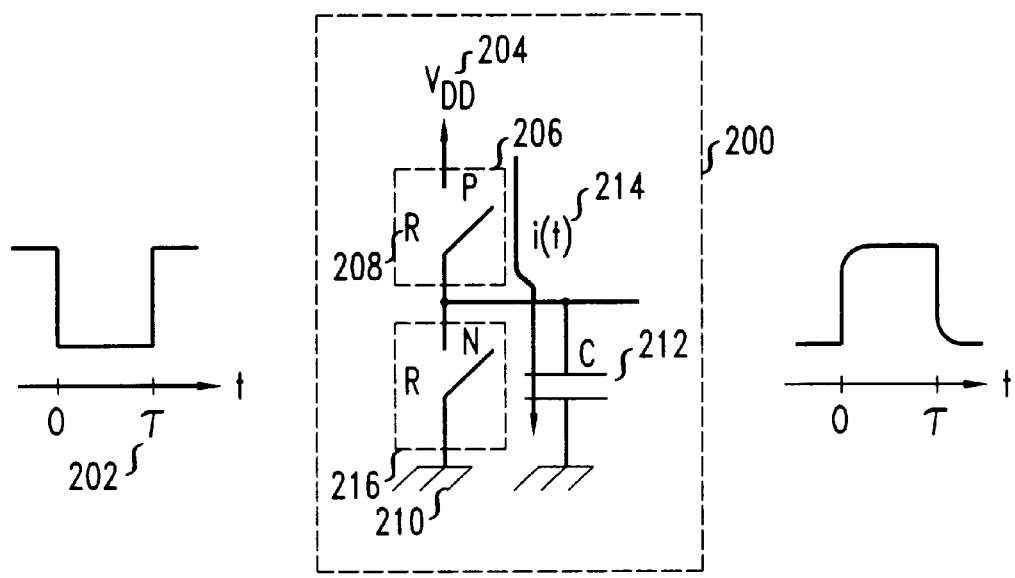
FIG. 2 illustrates the power dissipation in a CMOS circuit caused by a hazard pulse.

As discussed previously, power dissipation in a CMOS gate occurs whenever its output voltage level changes. More particularly, FIG. 2 shows an example of the power dissipation in a CMOS circuit, illustratively shown as an inverter, caused by a hazard pulse. The two transistor implementation of inverter 200 shown in FIG. 2 uses PMOS transistor 206 which shorts the supply $V_{DD}$ 204 to the output when the gate input is low. NMOS transistor 216 shorts the output to ground 210 when the gate input is high. The short-circuit impedance of each transistor is illustratively shown as "R" 208 while the total capacitance of the output node is illustratively shown as capacitor ("C") 212. The input to inverter 200 is illustratively shown as having a hazard pulse of width ($\tau$) 202 which is transmitted through inverter 200. At the falling edge (i.e., t=0), the PMOS transistor 206 is shorted and the NMOS transistor 216 is opened. This creates a path for the charging current i(t) 214 which begins to flow through the series combination of R 208 and C 212 given by the equation:

$$i(t) = \frac{V_{DD}}{R} e^{-\frac{t}{RC}} \qquad (2)$$

Thus, the charging of capacitor 212 raises the output voltage of the circuit until the time t=$\tau$ (i.e., when the rising edge occurs at the input; see FIG. 2). Therefore, the energy dissipation over time of inverter 200 is given by:

$$E(\tau) = \int_0^\tau V_{DD} i(t) dt = CV_{DD}^2 \left(1 - e^{-\frac{\tau}{RC}}\right) \quad (3)$$

Thus, the energy dissipated by a circuit, for example inverter 200, is proportional to the number of signal transitions at its output. Further, if the hazard pulse width τ is much greater than the time constant RC (see equations (2) and (3) above) of the charging circuit, the output voltage rises to the level of $V_{DD}$ and the maximum amount of dissipated energy is given by:

$$E_{max} = CV_{DD}^2 \text{ where } \tau \gg RC \quad (4)$$

Thus, one observes that by increasing the time constant RC of a particular gate, a corresponding significant decrease in energy dissipation is achieved.

Figure 3:
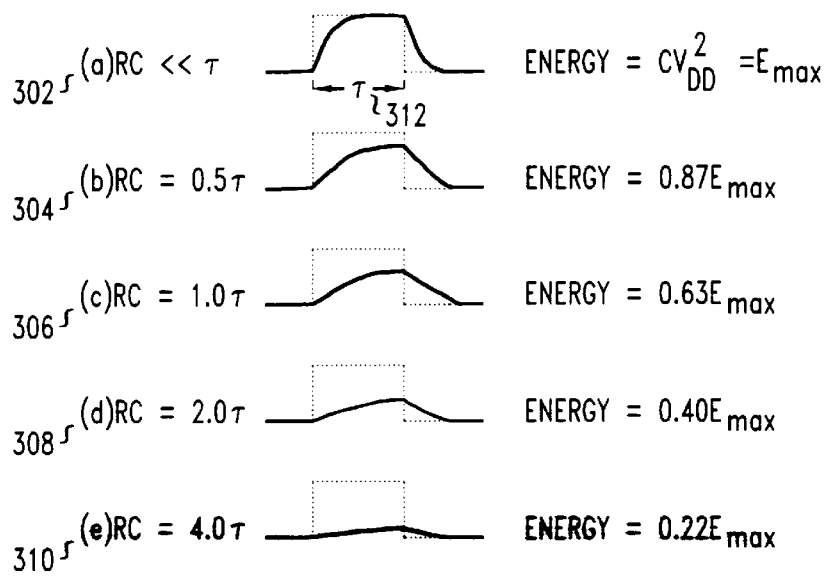
FIG. 3 illustrates the effect of various gate delays on power dissipation within the circuit of FIG. 2.

FIG. 3 illustrates several cases (302, 304, 306, 308 and 310) of the effect on energy dissipation as the time constant RC is increased with respect to the hazard pulse width (τ) 312. As shown in FIG. 3, when RC is significantly less than the hazard pulse width, the energy dissipation is at maximum levels (see, for example, case 302). However, as the RC is increased in relation to the hazard pulse width, the energy dissipation is significantly reduced (see, for example, cases 304 through 310). In particular, case 310 represents an RC value of four times the hazard pulse width resulting in approximately a 78% reduction in energy dissipation.

Figure 4:
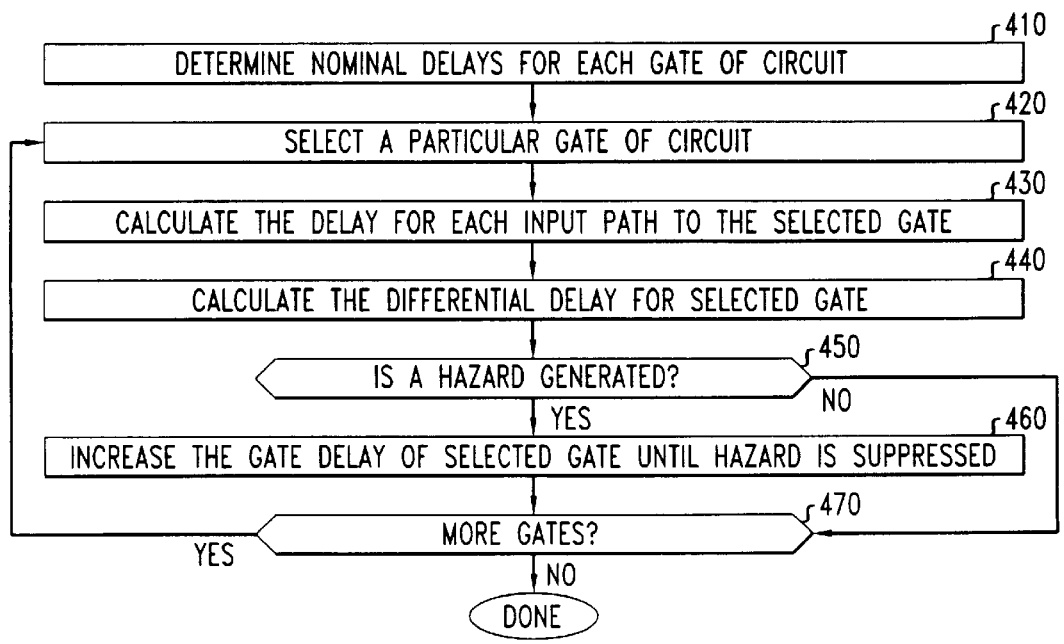
FIG. 4 is a flowchart of the hazard pulse suppression process of the present invention.

I have realized an iterative technique which may be applied to each gate within a circuit to take advantage of this relationship between increased gate delays and the reduction of power dissipation. Specifically, in accordance with the present invention, power dissipation reduction is realized through the suppression of hazards. By suppressing the hazards produced by gates throughout the circuit, the energy dissipation of the circuit is significantly decreased. FIG. 4 shows a flowchart of the illustrative process steps for designing a circuit in which hazard pulses are suppressed in accordance with the invention.

As shown in FIG. 4, in accordance with the invention, the delays (e.g., nominal delays) are determined for each gate of a circuit (410), e.g., a combinational logic circuit. Next a particular gate is selected (420); illustratively, the gates are selected beginning from the input to the output of the circuit. For the selected gate, the signal delay across each input path to that gate is calculated (430). After calculating the delays across the input paths to the selected gate, the differential delay for the selected gate is calculated (440), illustratively, as a function of the individual delays across the input paths as given in equation (1) above. As discussed previously, the differential delay can be determined, for example, as the maximum difference between individual path delays for paths terminating at different inputs of a gate. The gate is then analyzed to determine if it is a hazard-generating gate (450), i.e., the gate delay is substantially smaller than the maximum differential delay across the input paths, and if so, the overall delay of the selected gate is increased to suppress any hazard generation (460). A check is made to determine if there are additional gates in the circuit (470) and, if so, these are analyzed similarly as described above.

The principles and application of my hazard suppression invention, as discussed above in reference to FIG. 4, will now be further discussed within the context of two circuit examples which differ in their complexity.

Figure 5:
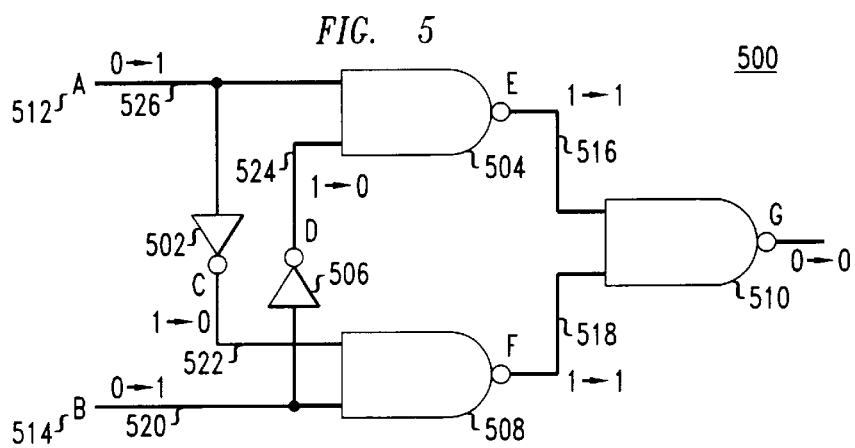
FIG. 5 shows a half-adder circuit to which the hazard pulse suppression process of the present invention is applied.

FIG. 5 shows a half-adder circuit 500 consisting of five individual gates (502, 504, 506, 508 and 510). In accordance with the invention, the delays for all gates and interconnections are examined for the production of hazard pulses. As will be appreciated by those skilled in the art, such gate delays are generally computed in circuit simulations using a variety of well known methods as further discussed, for example, in N. Weste et al., *Principles of CMOS VLSI Design: A Systems Approach*, Addison-Wesley, 1985. In general, gates may have different delays for rising and falling signals. In accordance with preferred embodiment of the invention, these differing delays are accounted for by considering two logical paths for each physical path. One of these paths will have the delay for the propagation of a rising transition while the other path has the delay of a falling transition. For the illustrative half-adder circuit 500, all gates have the same delay (e.g., one time unit) for either type of signal change.

Figure 6:
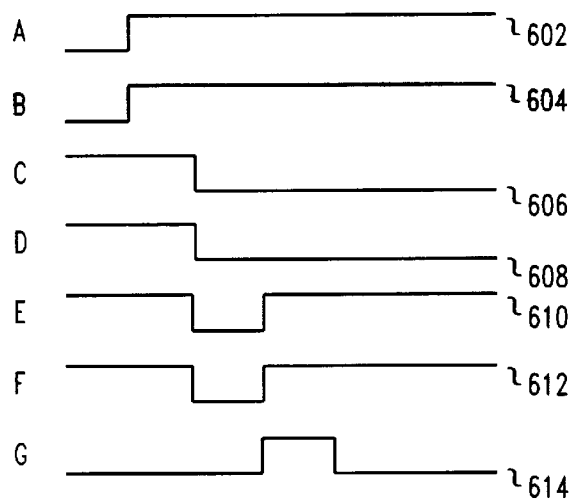
FIG. 6 shows waveforms of the signal transitions and hazard pulses generated by the circuit of FIG. 5.

Initially, half-adder circuit 500 is in steady state with inputs "A" 512 and "B" 514, set to 0. Illustratively, both of these inputs change value simultaneously as shown in waveforms 602 and 604 of FIG. 6. As will be appreciated by those skilled in the art, the waveforms shown in FIG. 6 are illustratively produced by a logic simulator. One time unit after the inputs change, gates 502 and 506, illustratively shown as inverters, produce falling transitions as shown in waveforms 606 and 608. At the same time, gates 504 and 508, illustratively shown as NAND gates, also produce falling transitions as shown in waveforms 610 and 612 which also show that these gates further experience rising transitions one time unit later. In turn, as seen in waveform 614, this produces a final steady state output for NAND gate 510 three time units after the change in primary inputs 512 and 514.

As shown in FIG. 5 and FIG. 6, gates 504, 508 and 510 each produces hazards causing power dissipation. In accordance with the invention, these hazards will be suppressed in order to significantly reduce the power dissipation of the circuit. More particularly with respect to this embodiment of the invention, gate 504 has two input paths (526 and 520/524) and gate 508 also has two input paths (520 and 526/522) which each produce differential delays of one unit. Further, gate 510 has four input paths (526/516, 526/522/518, 520/518 and 520/524/516) with a differential delay of one. In accordance with the invention, the hazards of gates 504, 508 and 510 will be suppressed by increasing their respective delays from one unit to two units. In turn, the delays of gates 502 and 506 are reduced to 0.5 units. As will be appreciated, applying the present invention may decrease the speed at which a particular circuit operates due to the increase in certain gate delays to suppress hazards. Therefore, for those gates which are not hazard-producing, this reduction in overall circuit speed can be mitigated by decreasing the delays of those non-hazard producing gates.

Figure 7:
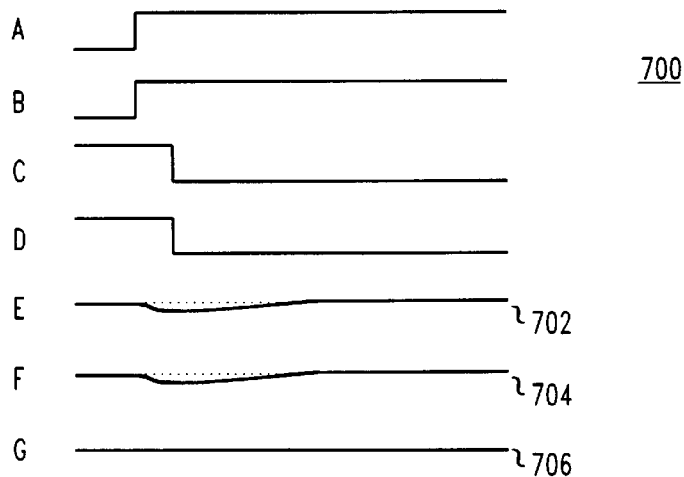
FIG. 7 shows waveforms of the signal transitions and the elimination of hazard pulses within the circuit of FIG. 5 after applying the invention.

The effect of applying the present invention to circuit 500 is shown in waveforms 700 of FIG. 7. In particular, waveforms 702, 704 and 706 illustrate that, for all practical purposes, the hazards generated by gates 504, 508 and 510 have been eliminated by adjusting the delays of these gates in accordance with the invention. The slight variation in the signals shown in waveforms 702 and 704 can be attributed to, for example, the partial charging and discharging of the output capacitors of gates 504 and 508 in circuit 500. As will be appreciated by those skilled in the art, any power dissipation now attributable to either of gates 504 or 508 is negligible and too small to switch the transistors of gate 510 as evidence by the total elimination of hazards shown in waveform 706.

Figure 8:
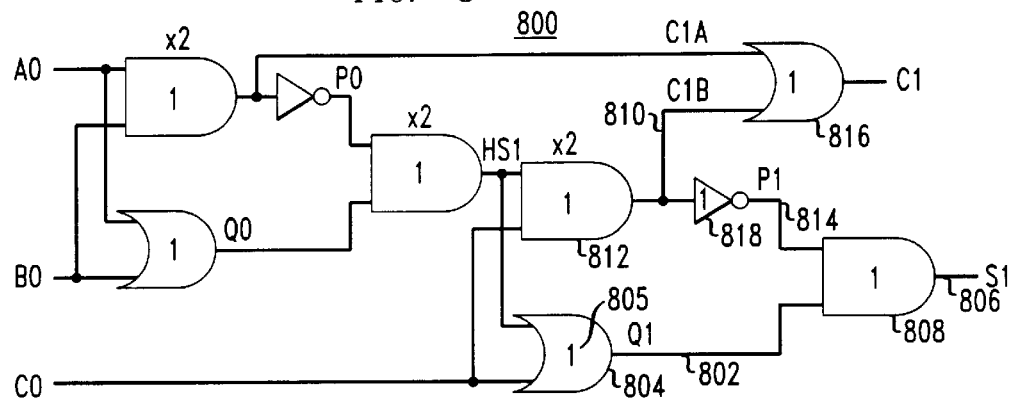
FIG. 8 shows a full-adder circuit to which the hazard pulse suppression process of the present invention is applied.
Figure 9:
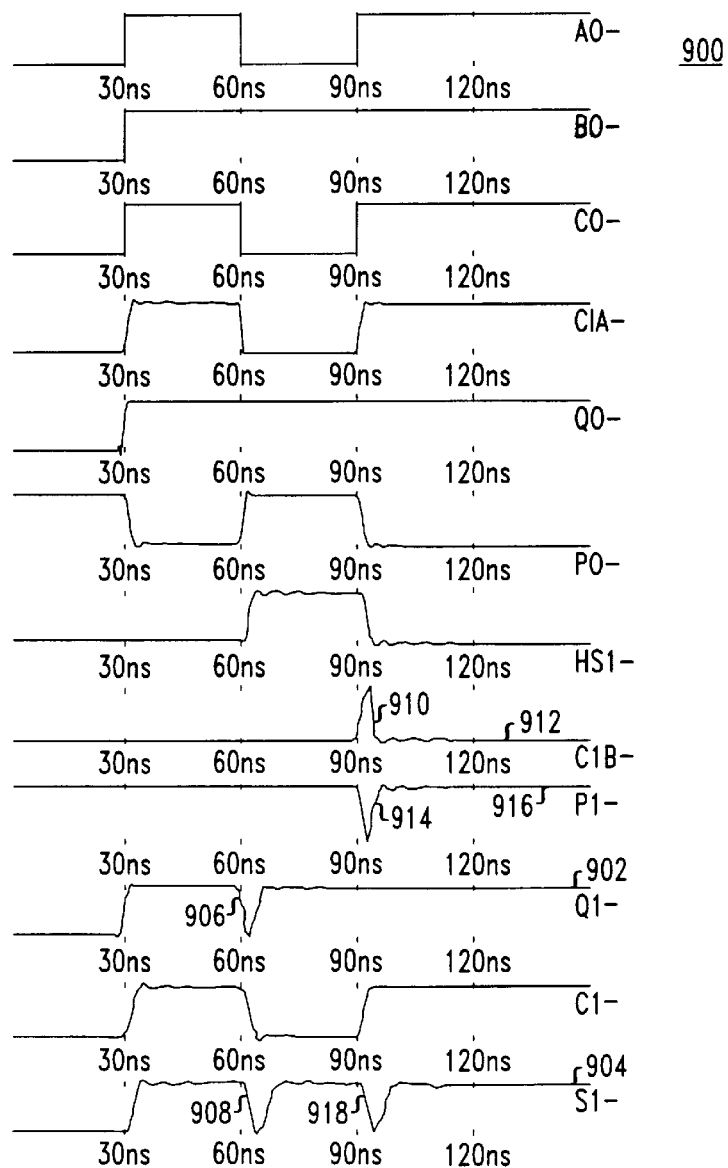
FIG. 9 shows simulation results for the circuit of FIG. 8.

My invention will now be further discussed in the context of a more complex circuit example. FIG. 8 shows a circuit schematic of full-adder circuit 800. As shown in FIG. 8, all of the gates of full-adder circuit 800 have nominal gate delays of one unit (see, for example, delay 805 of OR gate 804) which, for this example, is approximately 2 ns. Illustratively, to maintain this nominal delay for certain gates that serve as input to two other gates, the transistor size, i.e., channel width, has been doubled (shown in FIG. 8 as "x2" above gate 812). A circuit simulation of full-adder circuit 800 was produced using the well known Spice simulator with full-adder circuit 800 implemented in $1\mu$ CMOS technology. Three input transitions, applied at 30 ns intervals, were used to perform the circuit simulation with the simulation results 900 shown in FIG. 9.

From the examination of simulation results 900, one can see that no hazards were produced at the end of the 30 ns interval. However, at 60 ns, hazards 906 and 908 were generated at the output 802 of gate OR 804 and output 806 of AND gate 808 as shown in waveforms 902 and 904, respectively. At the end of the 90 ns interval, hazard 910 was generated at output 810 of AND gate 812 (see, waveform 912), hazard 914 was generated at output 814 of inverter gate 818 (see, waveform 916), and hazard 918 was generated at output 806 of AND gate 808 (see, waveform 916), and hazard 918 was generated at hazards will cause a certain degree of power dissipation in full-adder circuit 800. Illustratively, in accordance with the invention, an iterative procedure of differential gate delay computation and increases in gate delays is applied to suppress the hazards thereby leading to the reduction of power dissipation.

In accordance with the preferred embodiment of the invention, the differential path delays for each gate are calculated. The results of applying the differential path delay calculations to full-adder circuit 800 of this embodiment of the invention are shown in circuit 1000 of FIG. 10. Of particular interest are the resultant differential delays (see, 1010, 1012, 1014 and 1016) of gates 804 (3 units of delay), 808 (4 units of delay), 812 (3 units of delay) and 816 (5 units of delay) shown in FIG. 10. In accordance with the invention, these differential path delays will be used to adjust the delays of these gates to eliminate any hazards and therefore reduce the power dissipation of full-adder circuit 800.

In accordance with this embodiment of the invention, the increased delay d(g) to be applied to certain ones of the gates is calculated as a function of the differential delay w(g) given by the following equation:

$$d(g)=\alpha \cdot w(g) \text{ where } \alpha \geq 1. \quad (5)$$

Illustratively, the ratio $\alpha$ is selected based upon the particular characteristics of the technology from which, in this example, full-adder circuit 800 is fabricated. For example, different CMOS technologies may use varying dopant levels which will effect circuit performance which, in turn, can be used effectively to adjust the individual delays of circuit gates. Such effects of various semiconductor process technologies is discussed in more detail, for example, in Ballaouar, supra, at pp. 13–56. As will be appreciated by those skilled in the art, a circuit simulation tool (e.g., the Spice simulator previously discussed) can be used to determine a suitable value for the ratio $\alpha$ given the requisite input conditions regarding technology parameters used in creating the simulation. Further, as will be appreciated by those skilled in the art, the delay of a gate is further dependent upon the RC time constant, and either R, or C, or both may be changed to affect the gate delay. Usually the resistance value (i.e., R) is easiest to adjust due to its dependence upon the channel width and length of transistors.

Figure 10:
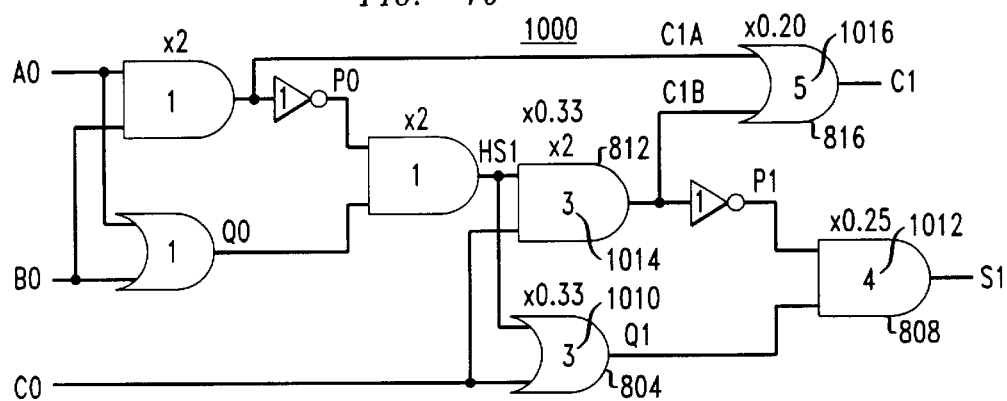
FIG. 10 shows the full-adder circuit of FIG. 8 with the increased delays as determined in accordance with the invention.

Therefore, in accordance with this embodiment of the invention, a ratio of $\alpha=1$ was selected on the basis that full-adder circuit 800 is implemented in $1\mu$ CMOS semiconductor technology. In accordance with the embodiment, a minimum value for ratio $\alpha$ which will ensure the suppression of the hazard pulses in accordance with equation (5) above is selected. By minimizing $\alpha$ we can reduce the impact of slower circuit speeds while at the same time ensuring that hazards are suppressed in accordance with the invention. Therefore, the delays 1010 through 1016 (see, FIG. 10) of gates 804, 808, 812 and 816 will be adjusted as a function of their differential delays. Thus, as shown in FIG. 10, the delay of OR gate 804 is increased to 3 units (i.e., d(g)=1(3)=3) from the original nominal delay of 1 unit (see, FIG. 8). This delay is illustratively achieved by reducing the size of the transistors (e.g., channel width) comprising OR gate 804 by a factor of 0.33 (illustratively shown as "x0.33" above gate 804 in FIG. 10). Similarly, in accordance with the invention, the delays of gates 808, 812 and 816 are increased to 4, 3 and 5 units respectively from their original nominal delays of 1 unit.

The advantages of the present invention are further apparent in, for example, the formation of the logic structure of an integrated circuit. As the logic structure for the integrated circuit is analyzed for example, in a simulation or computer aided design tool, the above-described gate delay adjustments for hazard pulse suppression in accordance with the invention are made. Thus, the resulting logic structure of the integrated circuit suppresses any hazard pulses which may have caused power dissipation.

Figure 11:
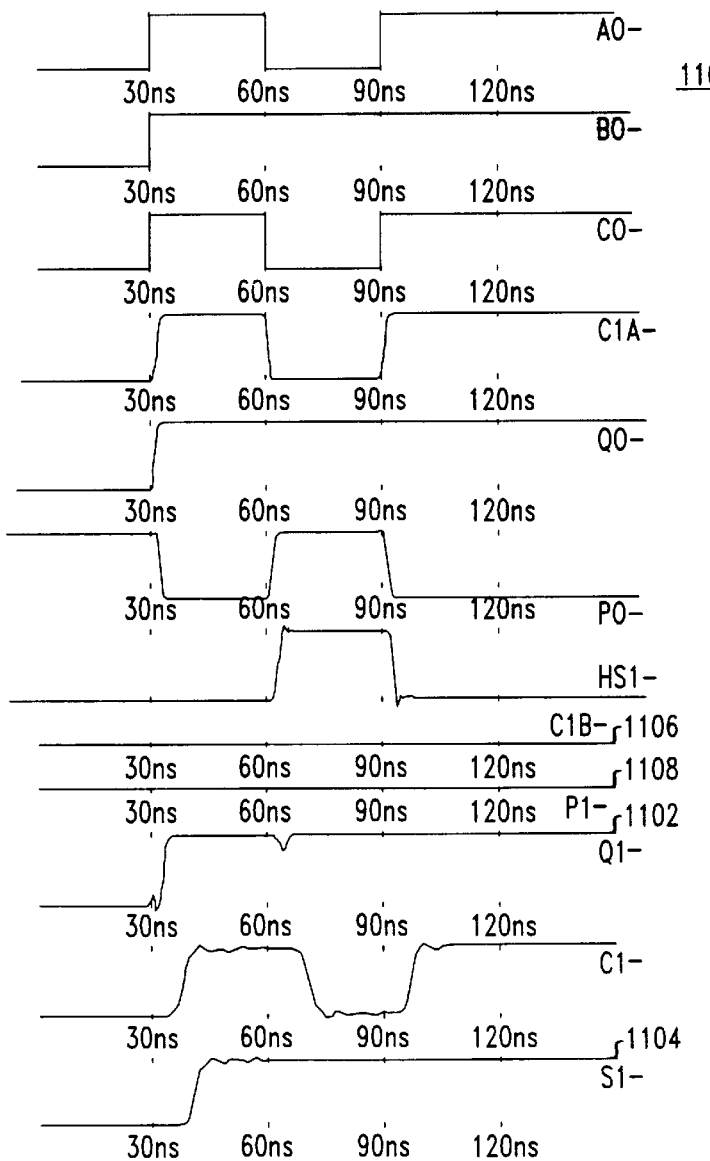
FIG. 11 shows simulation results for the circuit of FIG. 10.

For example, a simulation of circuit 1000 was performed using the above-described gate delay adjustments for hazard pulse suppression in accordance with the invention. The resulting waveforms 1100 obtained from this Spice simulation are shown in FIG. 11. In particular, the hazards exhibited by the original circuit design at the 60 ns and 90 ns intervals are completely eliminated by the application of the hazard suppression invention as shown, for example, in waveforms 1102, 1104, 1106 and 1108. Further, a comparison of simulation results 900 (see, FIG. 9) with those of FIG. 11 shows a 42% reduction of the number of transitions produced in the circuit from 24 to 14. Advantageously, such a significant reduction in signal transitions leads to a reduction in power dissipation of full-adder circuit 800. This is confirmed by the transient power supply current for full-adder circuit 800 as computed from the Spice simulator and shown in FIG. 12.

Figure 12:
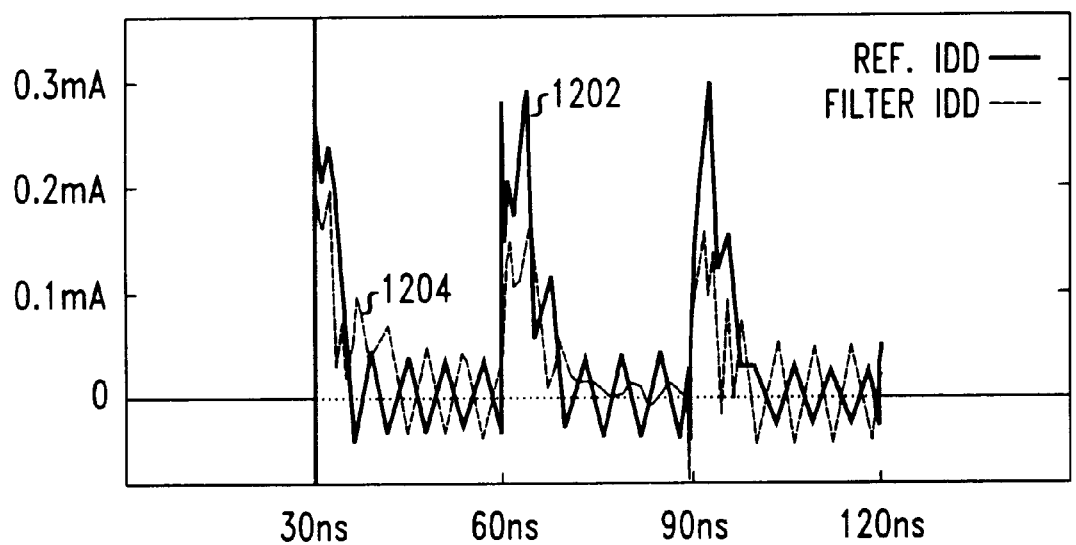
FIG. 12 shows a comparison of the transient power supply current for the circuits of FIG. 8 and FIG. 10.

FIG. 12 shows comparison results 1200 of the transient power supply current for full-adder circuit 800 in its original state and after application of the hazard filtering technique of the present invention. The Ref. $I_{dd}$ 1202 associated with the original design of full-adder circuit 800 and Filter $I_{dd}$ 1204 is associated with the revised circuit design (see, circuit 1000 of FIG. 10) as determined in accordance with the invention. Significantly, where hazards were eliminated in accordance with the invention, i.e., at the 60 ns and 90 ns intervals, the reduction in current of full-adder circuit 800 is notable. As will be appreciated by those skilled in the art, this current reduction is indicative of a corresponding reduction in power dissipation.

The foregoing merely illustrates the principles of the present invention. Those skilled in the art will be able to devise numerous arrangements which, although not explicitly shown or described herein, embody those principles and are within their spirit and scope.

I claim:

1. A method for use in designing a circuit having a plurality of gates, the method comprising the steps of:

determining a delay for each gate of the plurality of gates, the delay being determined as function of one or more individual delays occurring across one or more input paths of the gate;

identifying particular ones of the plurality of gates which generate a hazard pulse; and adjusting the delay of each of the particular ones of the plurality of gates to suppress the hazard pulse generated by the gate.

2. The method of claim 1 wherein the determining step further determines the delay as a function of a maximum difference between particular ones of the individual delays.

3. The method of claim 1 wherein the adjusting step increases the delay of at least one of the particular ones of the gates.

4. The method of claim 3 wherein the increase to the delay is determined as a function of the circuit's fabrication characteristics.

5. The method of claim 3 wherein the adjusting step decreases the delay of at least one of the plurality of gates.

6. The method of claim 2 wherein the adjusting step results in a reduction in the circuit's power dissipation.

7. The method of claim 2, herein the determining step operates on the plurality of gates in an order from the circuit's input to the circuit's output.

8. A method for suppressing hazard pulses in a circuit, the circuit having a plurality of gates, the method comprising the steps of:

calculating a plurality of signal delays associated with each gate of the plurality of gates, at least one signal delay of the plurality of signal delays being calculated as a function of a corresponding one input path of the gate;

determining an overall gate delay for each gate of the plurality of gates as a function of the plurality of signal delays for that gate;

identifying particular ones of the plurality of gates which generate the hazard pulses in the circuit; and adjusting the overall gate delay of each of the particular ones of the gates which generate the hazard pulses.

9. The method of claim 8 wherein the adjusting step increases the overall gate delay of at least one of the particular ones of the gates.

10. The method of claim 9 wherein the adjusting step decreases the overall gate delay of at least one of the plurality of gates.

11. The method of claim 9 wherein the calculating step calculates the overall gate delay for the gate as a function of a maximum difference between particular ones of the signal delays.

12. An integrated circuit having a logic structure in which hazard pulses are suppressed, the logic structure formed by determining a delay for each gate of a plurality of gates within the integrated circuit, the delay being determined as function of one or more individual delays occurring across one or more input paths of the gate, identifying particular ones of the plurality of gates which generate a hazard pulse, and adjusting the delay of each of the particular ones of the plurality of gates to suppress the hazard pulse generated by the gate.

13. The integrated circuit of claim 12 wherein the adjusting the delay increases the gate delay of at least one of the particular ones of the gates.

14. The integrated circuit of claim 13 wherein the adjusting the delay decreases the gate delay of at least one of the plurality of gates.

* * * * *